United States Patent
Tseng (10) Patent No.: US 7,299,391 B2
(45) Date of Patent: Nov. 20, 2007

(54) CIRCUIT FOR CONTROL AND OBSERVATION OF A SCAN CHAIN

(75) Inventor: Huan-Yung Tseng, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 1194 days.

(21) Appl. No.: 10/281,973

(22) Filed: Oct. 29, 2002

(65) Prior Publication Data

US 2004/0081208 A1   Apr. 29, 2004

(51) Int. Cl.
*G01R 31/28* (2006.01)

(52) U.S. Cl. .................... 714/729; 714/727
(58) Field of Classification Search ................ 714/727, 714/726, 729, 738
See application file for complete search history.

(56) References Cited

U.S. PATENT DOCUMENTS

| | | | | |
|---|---|---|---|---|
| 5,329,533 A | * | 7/1994 | Lin | 714/727 |
| 5,448,575 A | * | 9/1995 | Hashizume | 714/727 |
| 5,450,414 A | * | 9/1995 | Lin | 714/726 |
| 5,726,998 A | * | 3/1998 | Ozaki | 714/726 |
| 5,925,143 A | * | 7/1999 | Gillis et al. | 714/726 |
| 6,370,664 B1 | * | 4/2002 | Bhawmik | 714/729 |
| 6,615,380 B1 | * | 9/2003 | Kapur et al. | 714/738 |

* cited by examiner

*Primary Examiner*—David Ton
(74) *Attorney, Agent, or Firm*—Winston Hsu (57) ABSTRACT

A circuit for control and observation of a scan chain. The circuit comprises a group of first scan cells connected in series, receiving a first data signal and outputting a second data signal, a multiplexer receiving the first and second data signal, and selectively outputting the first and second data signal in response to a selection signal, and a group of second scan cells connected in series, receiving the first or second data signal from the multiplexer, and outputting a third data signal.

17 Claims, 8 Drawing Sheets

CIRCUIT FOR CONTROL AND OBSERVATION OF A SCAN CHAIN

BACKGROUND OF THE INVENTION

1. Field of the Invention

The present invention relates to a peripheral circuit of a scan chain and particularly to a circuit for control and observation of a scan chain.

2. Description of the Prior Art

Figure 1:
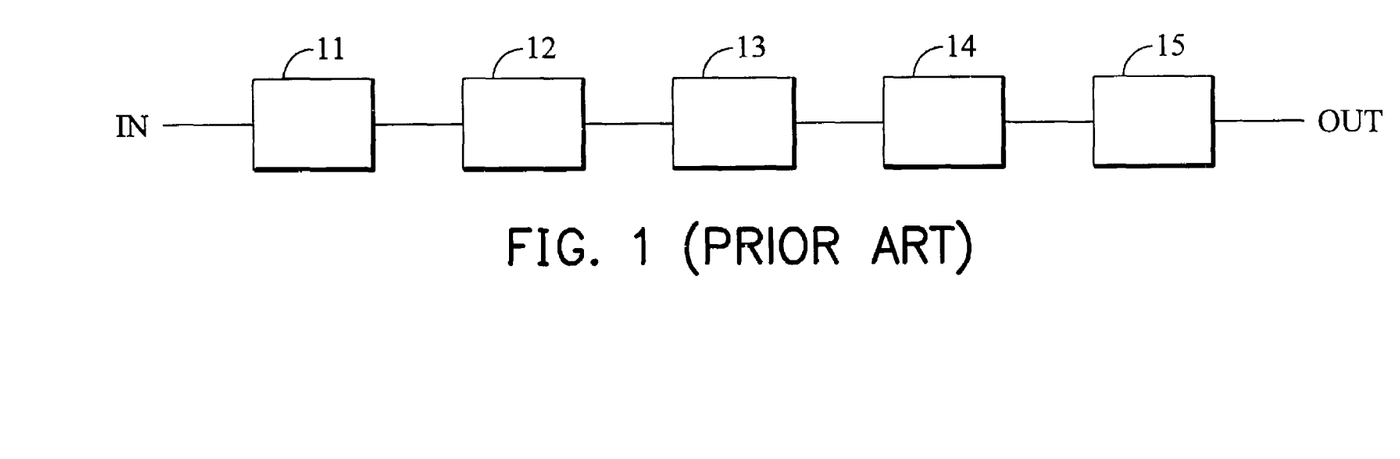
FIG. 1 is a diagram showing a conventional scan chain.

FIG. 1 is a diagram showing a conventional scan chain. It includes five (for example) shift registers 11~15 connected in series. Each of the shift registers 11~15 is a scan cell. The first shift register 11 receives a data signal from a tester (not shown). In response to a clock signal, the bits carried by the data signal are forwarded through the shift registers 11~15 one by one and stored therein. Then, the stored bits are sent to a device under test (DUT). The data with which the DUT responds to the scan chain is sent back to the tester for data comparison. Results of the data comparison determine whether the DUT fails.

The results of the data comparison are reliable only when the scan chain operates correctly. If any one of the shift register 11~15 malfunctions so that its output gets stuck at "1", the final output of the scan chain will also get stuck at "1" despite any "0" bit in the data signal. However, in the conventional scan chain, there is no means for monitoring the scan cells.

SUMMARY OF THE INVENTION

The object of the present invention is to provide a circuit for control and observation of a scan chain, which monitors inputs and outputs of the scan cells, and interrupts the forwarding of the bits between the cells if some necessary corrections are needed.

The present invention provides a circuit for control and observation of a scan chain. The circuit comprises a group of first scan cells connected in series, receiving a first data signal and outputting a second data signal, a multiplexer receiving the first and second data signal, and selectively outputting the first and second data signal in response to a selection signal, and a group of second scan cells connected in series, receiving the first or second data signal from the multiplexer, and outputting a third data signal.

The present invention further provides a circuit for control and observation of a scan chain. The circuit comprises a group of first scan cells connected in series, receiving a first data signal and outputting a second data signal, a first control gate receiving the second data signal and a first enable signal, and selectively outputting the second and a third data signal in response to the first enable signal, and a group of second scan cells connected in series, receiving the second or third data signal from the first control gate, and outputting a fourth data signal.

The present invention also provides a circuit for control and observation of a scan chain. The circuit comprises a group of first scan cells connected in series, receiving a first data signal and outputting a second data signal, a first multiplexer receiving the second and a third data signal, and selectively outputting the second and third data signal in response to a first selection signal, a group of second scan cells connected in series, receiving the second or third data signal from the first multiplexer, and outputting a fourth data signal, a second multiplexer receiving the second and fourth data signal, and selectively outputting the second and fourth data signal in response to a second selection signal, a third multiplexer receiving the second and fourth data signal, and selectively outputting the second and fourth data signal in response to a third selection signal, and an XOR gate receiving the second or fourth data signal from the second multiplexer, and the second or fourth data signal from the third multiplexer.

Thus, in the present invention, the scan cells are divided into groups, and a multiplexer or control gate selectively blocks the output from one group of cells to dominate the input to the following group of cells. This provides a means for monitoring the scan chain.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 2:
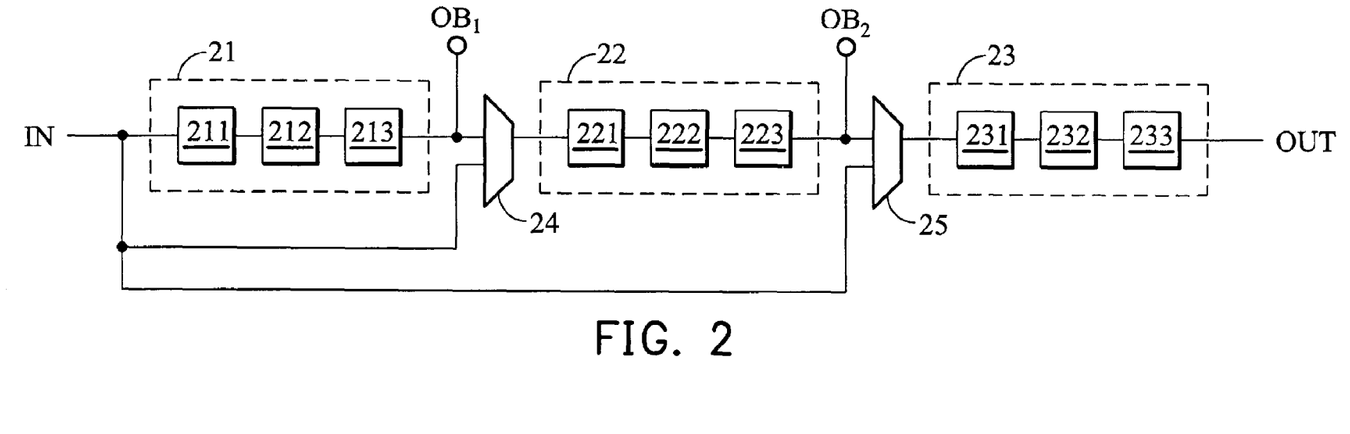
FIG. 2 is a diagram showing a circuit for control and observation of a scan chain according to a first embodiment of the invention.

FIG. 2 is a diagram showing a circuit for control and observation of a scan chain according to a first embodiment of the invention. It includes three groups of scan cells 21~23, for example, and two multiplexers 24 and 25. There are scan cells (shift registers) 211, 212 and 213, 221, 222 and 223, and 231, 232 and 233 in the groups 21, 22 and 23 respectively. The scan cell group 21 receives a data signal IN from a tester (not shown). In response to a clock signal, the bits carried by the data signal IN are forwarded through the cells 211~213, whereby the scan cell group 21 outputs a data signal at a terminal OB1 to the multiplexer 24. The multiplexer 24 receives both of the signals from the tester and the scan cell group 21, and selects one of the received signals to be transferred to the following scan cell group 22 in response to a selection signal. Similarly, in response to the clock signal, the bits carried by the data signal from the multiplexer 24 are forwarded through the cells 221~223, whereby the scan cell group 22 outputs a data signal at a terminal OB2 to the multiplexer 25. The multiplexer 25 receives both of the signals from the tester and the scan cell group 22, and selects one of the received signals to be transferred to the following scan cell group 23 in response to the selection signal.

Additionally, counters (not shown) may be connected to receive the data signals at the terminals OB1 and OB2 to count the number of is and 0s in the data signals. An embedded memory device may be used to store the data carried by the data signals for data analysis.

Figure 3:
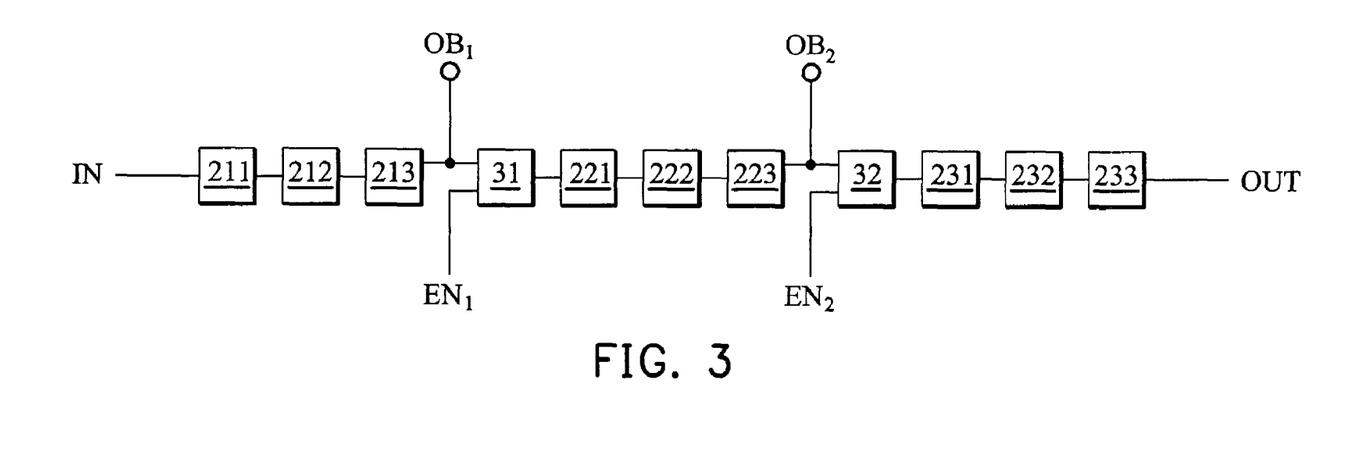
FIG. 3 is a diagram showing a circuit for control and observation of a scan chain according to a second embodiment of the invention.

FIG. 3 is a diagram showing a circuit for control and observation of a scan chain according to a second embodiment of the invention. The same elements in FIGS. 2 and 3 refer to the same symbol for clarity. It includes scan cells 211~213, 221~223, and 231~233 (shift registers) connected in series, and control gates 31 and 32. In response to a clock signal, a bit input to each of the cells 211~213, 221~223, and 231~233 are forwarded. The control gate 31 receives a data signal from the cell 213 and an enable signal EN1. The control gate 31 selects the signal from the cell 213 or a signal carrying predetermined data to be transferred to the cell 221 in response to the enable signal EN1. That is to say, the control gate 31 will block the output from the cell 213 and dominate the input of the cell 221 when the enable signal EN1 is asserted. Similarly, multiplexer 24 receives both of the signals from the tester and the scan cell group 21, and selects one of the received signals to be transferred to the following scan cell group 22 in response to a selection signal. Similarly, the control gate 32 receives a data signal from the cell 213 and an enable signal EN1. The control gate 31 selects the signal from the cell 223 or a signal carrying predetermined data to be transferred to the cell 231 in response to the enable signal EN2. That is to say, the control gate 32 will block the output from the cell 223 and dominate the input of the cell 231 when the enable signal EN2 is asserted.

Additionally, counters (not shown) may be connected to receive the data signals at the terminals OB1 and OB2 to count the number of is and 0s in the data signals. An embedded memory device may be used to store the data carried by the data signals for data analysis.

FIGS. 4A~4D are diagrams showing the control gates used in the second embodiment of the invention.

Figure 4A:
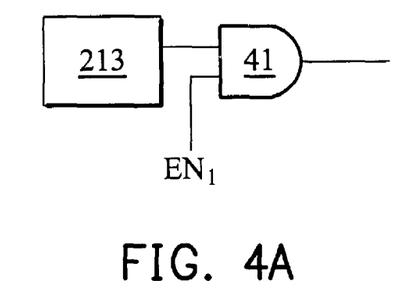
FIGS. 4A~4D are diagrams showing the control gates used in the second embodiment of the invention.

As shown in FIG. 4A, the control gate 31 may be an AND gate 41. The AND gate 41 outputs a low logic voltage level representing the bit "0" when the enable signal EN1 is at the low logic voltage level, and transfers the signal output from the cell 213 when the enable signal EN1 is at a hihg logic voltage level.

Figure 4B:
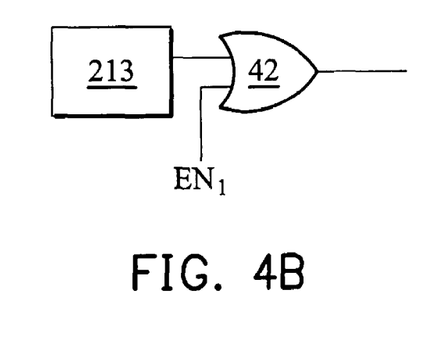

As shown in FIG. 4B, the control gate 31 may be an OR gate 42. The OR gate 42 outputs the high logic voltage level representing the bit "1" when the enable signal EN1 is at the high logic voltage level, and transfers the signal output from the cell 213 when the enable signal EN1 is at the low logic voltage level.

Figure 4C:
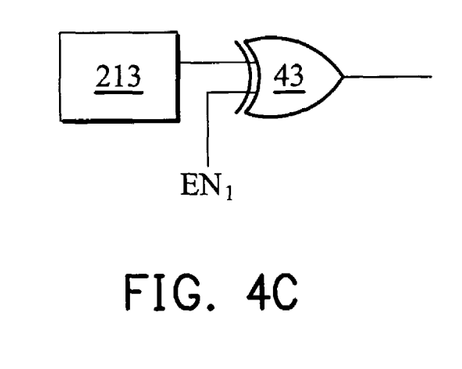

As shown in FIG. 4C, the control gate 31 may be an XOR gate 43. The XOR gate 43 outputs an inverted signal of the signal from the cell 213 when the enable signal EN1 is at the high logic voltage level, and transfers the signal output from the cell 213 when the enable signal EN1 is at the low logic voltage level.

Figure 4D:
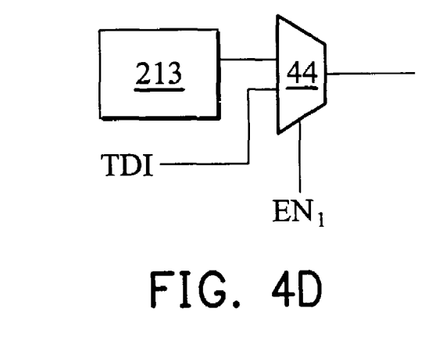

As shown in FIG. 4D, the control gate 31 may be a multiplexer 44. The multiplexer 44 receives a data signal TD1 and the signal output from the cell 213. The multiplexer 44 selects the signal from the cell 213 to be transferred, when the enable signal EN1 is at the high logic voltage level, and selects the data signal TD1 to be transferred when the enable signal EN1 is at a low logic voltage level.

Figure 5:
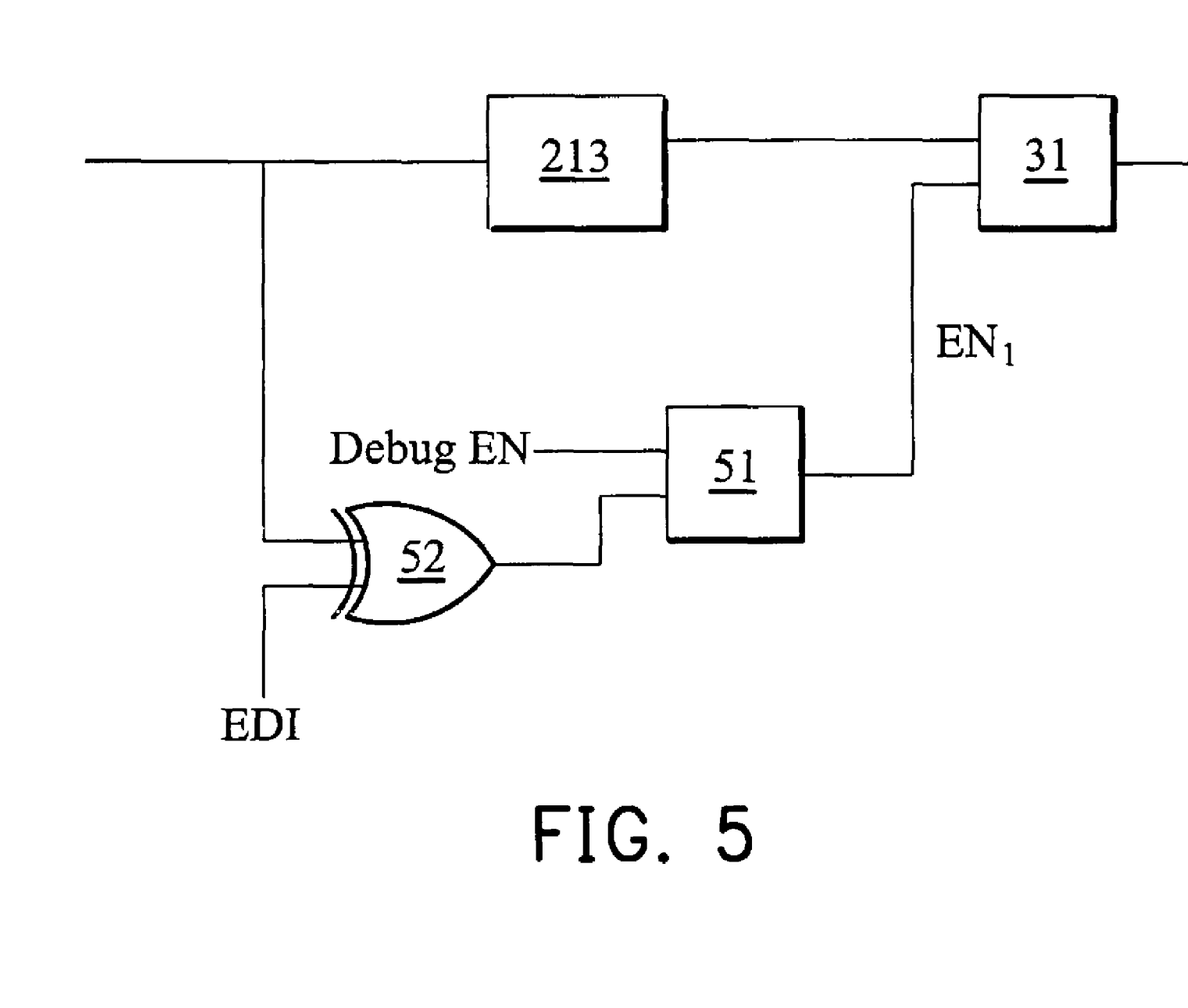
FIG. 5 is a diagram showing another control gate circuit used in the second embodiment of the invention.

Further, the enable signal EN1 may be derived from an embedded memory or another control gate circuit shown in FIG. 5. An XOR gate 52 receives the signal from the cell 213 and a data signal EDI. The XOR gate 52 outputs the low logic voltage level when the received bits of the two signals are the same, and outputs the high logic voltage level when the received bits of the two signals are different. A control gate 51 receives an enable signal DebugEN and the signal output from the XOR gate 52, and generates the enable signal EN1. The control gate 31 selects the signal from the cell 213 to be transferred when the XOR gate 52 outputs the low logic voltage level and the enable signal DebugEN is at the high logic voltage level, and selects the signal EDI carrying predetermined data to be transferred when the XOR gate 52 outputs the high logic voltage level and the enable signal DebugEN is at the high logic voltage level. That is to say, the control gate 31 will block the output from the cell 213 and dominate the input of the cell 221 when the enable signal EN1 is asserted.

In FIG. 5, the control gate 31 and 51 may be an OR and AND gate respectively. The control gate 31 and 51 may be an XOR and AND gate respectively. The control gate 31 and 51 may be an AND and NAND gate respectively.

Figure 6:
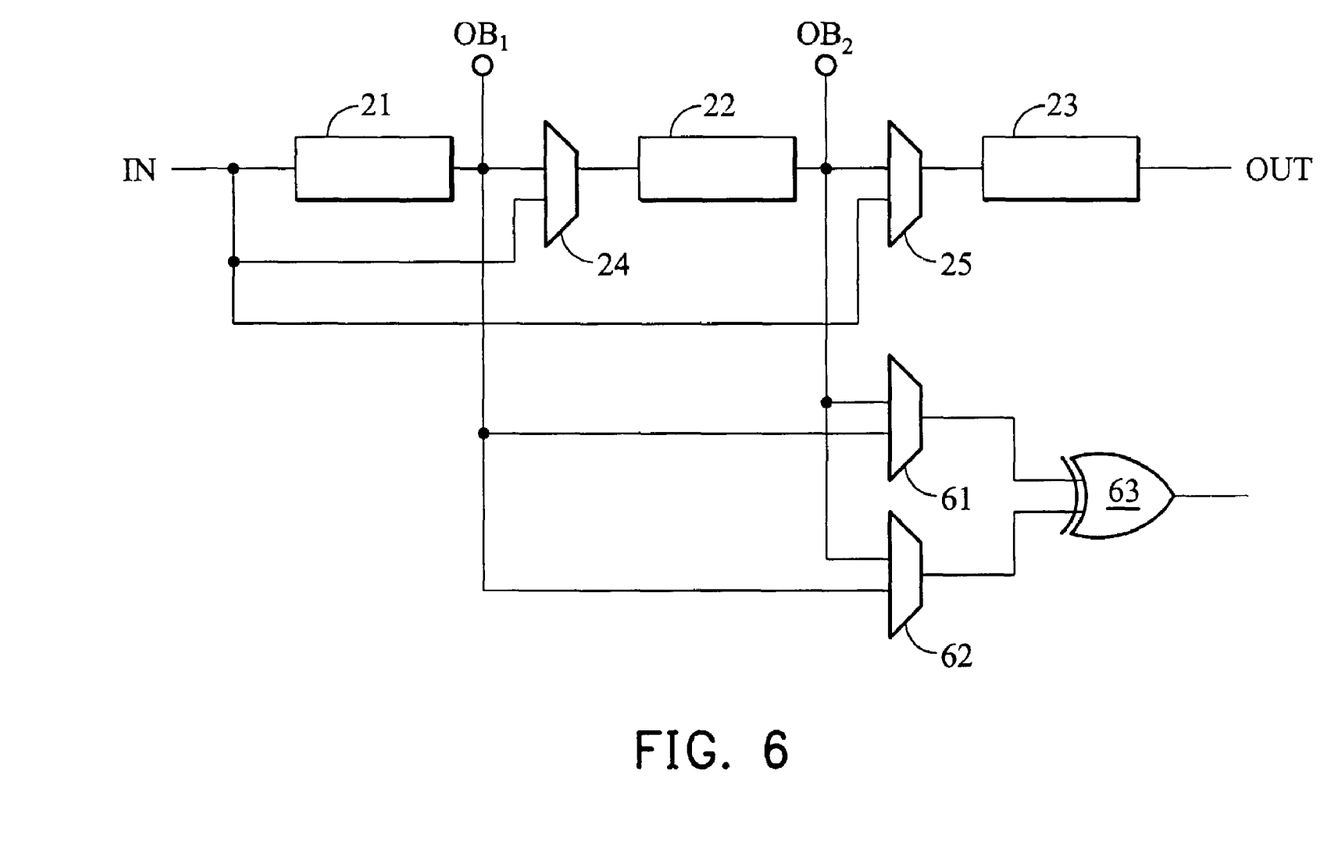
FIG. 6 is a diagram showing a circuit for control and observation of a scan chain according to a third embodiment of the invention.

FIG. 6 is a diagram showing a circuit for control and observation of a scan chain according to a third embodiment of the invention. The same elements in FIG. 2 and FIG. 6 refer to the same symbol for clarity. By comparing FIG. 2 and FIG. 6, it is noted that multiplexers 61 and 62, and an XOR gate 63 are added in the circuit of FIG. 6. The multiplexer 61 receives the signals from the scan cell groups 21 and 22, and selects one of the two signals to be transferred. Similarly, the multiplexer 62 also receives the signals from the scan cell groups 21 and 22, and selects one of the two signals to be transferred. The XOR gate 63 acts as a comparator for the two signals output from the scan cell groups 21 and 22. The XOR gate 63 outputs the low logic voltage level when the bits received from the two signals are the same, and outputs the high logic voltage level when the bits are different.

Figure 7:
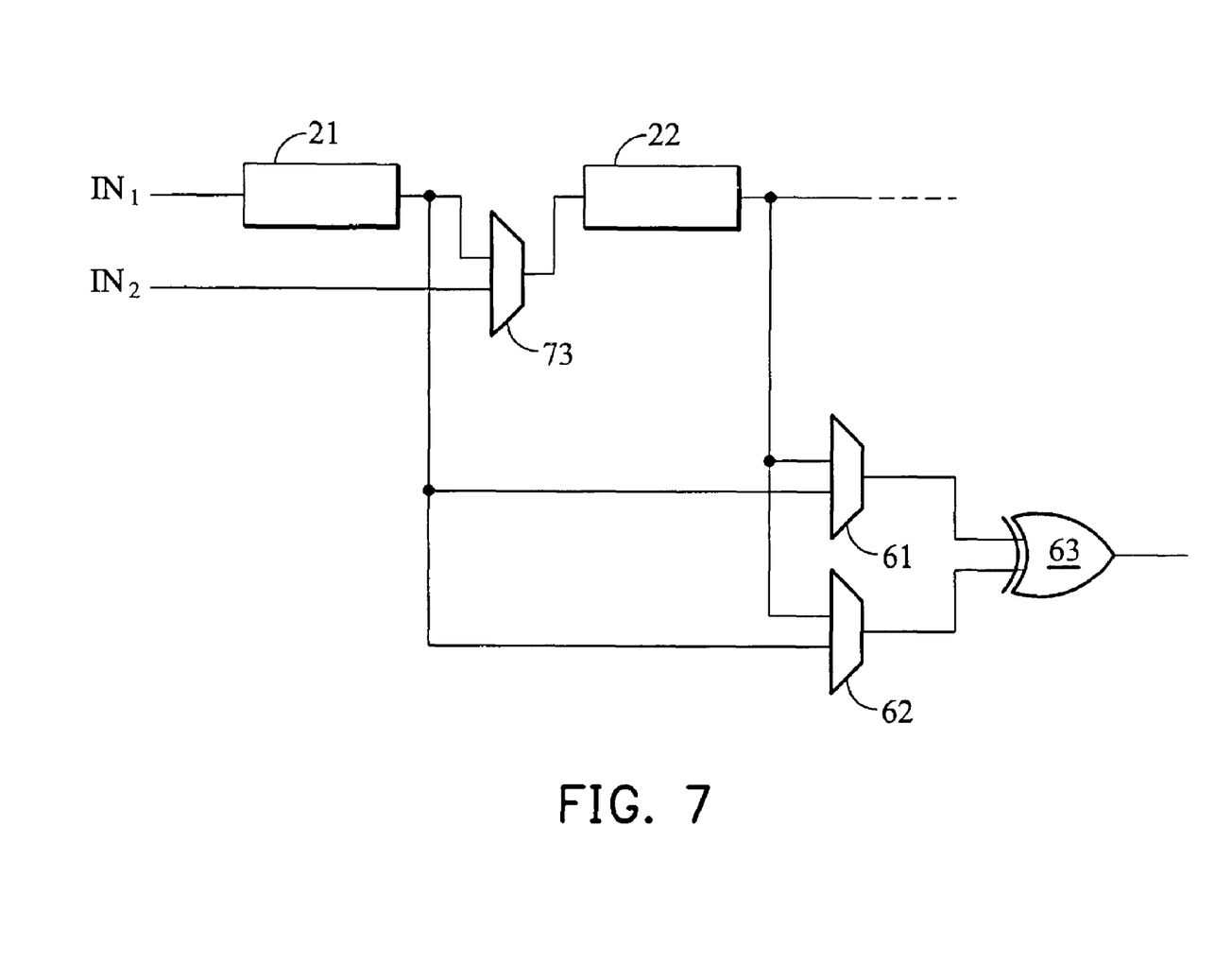
FIG. 7 is a diagram showing a circuit for control and observation of a scan chain according to a fourth embodiment of the invention.

FIG. 7 is a diagram showing a circuit for control and observation of a scan chain according to a fourth embodiment of the invention. The same elements in FIG. 6 and FIG. 7 refer to the same symbol for clarity. It includes scan cell groups 21 and 22, multiplexers 73, 61 and 62, and an XOR gate 63. By comparing the circuits in FIGS. 6 and 7, it is noted that the data signal from the tester may be the signal IN1 or IN2 instead of only the signal IN in the circuit of FIG. 7. The multiplexer 73 receives the signal from the scan cell group 21 and the signal IN2, and selects one of the two signals to be transferred to the scan cell group 22 in response to a selection signal.

Figure 8:
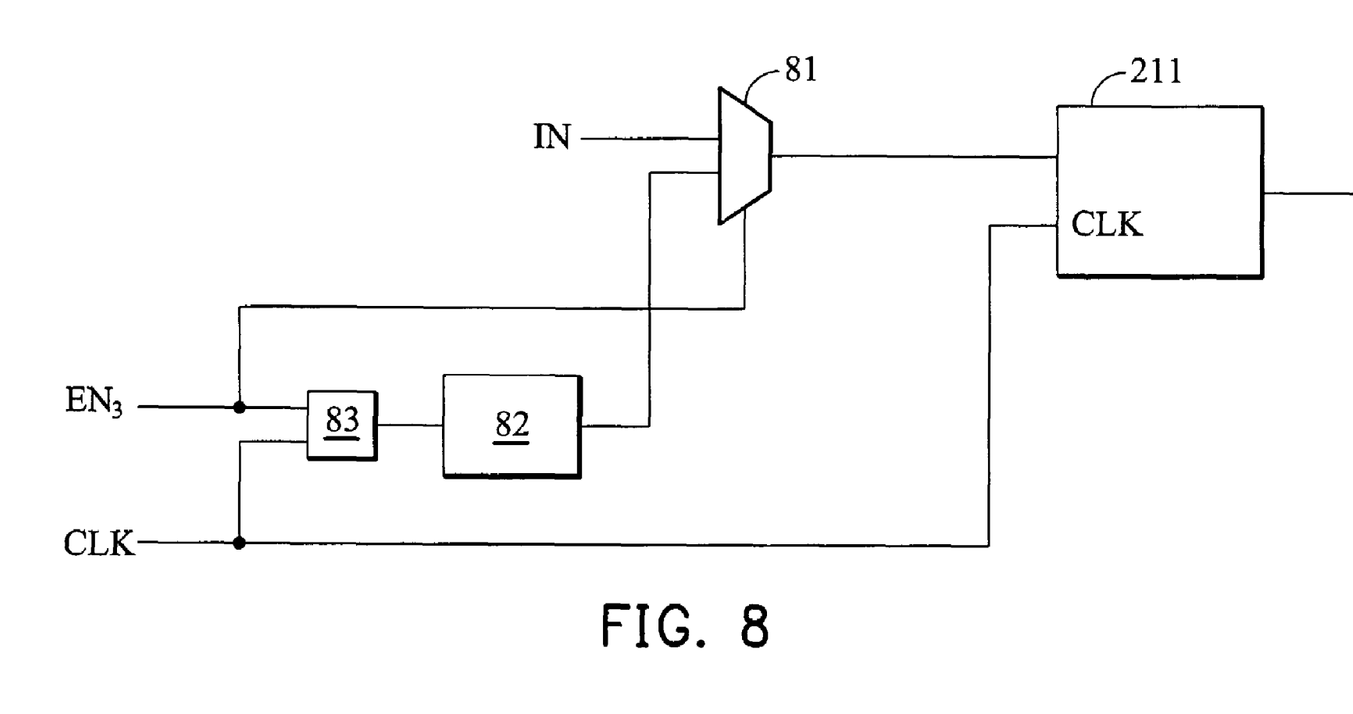
FIG. 8 is a diagram showing a circuit for control and observation of a scan chain according to a fifth embodiment of the invention.

FIG. 8 is a diagram showing a circuit for control and observation of a scan chain according to a fifth embodiment of the invention. It includes a linear feedback shift register (LFSR) 82. Accompanied with the multiplexer 81, it provides more than one signal to be selectively transferred to the first scan cell 211.

Figure 9:
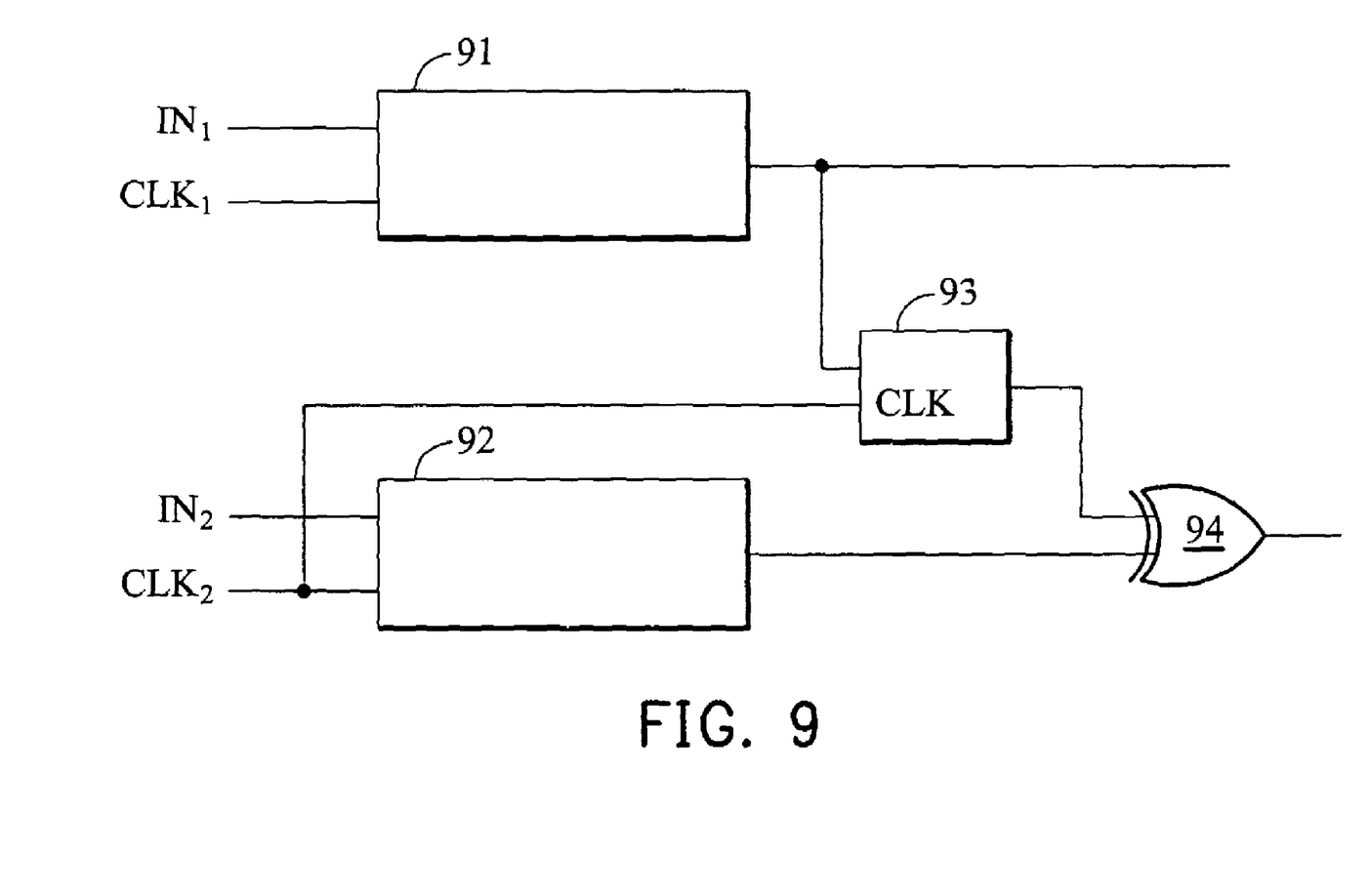
FIG. 9 is a diagram showing a circuit for control and observation of a scan chain according to a sixth embodiment of the invention.

FIG. 9 is a diagram showing a circuit for control and observation of a scan chain according to a sixth embodiment of the invention. It uses a latch circuit 93 to latch the data output from the scan cell groups 91 and 92 with different lengths. Thus, it is possible to compare the data of different lengths by the XOR gate 93 which acts as a comparator. The clock signal CLK of the latch circuit 93 is one of the clock signals CLK1 and CLK2 which has the lower frequency.

In conclusion, the present invention provides a circuit for control and observation of a scan chain. The scan cells are divided into groups, and a multiplexer or control gate selectively blocks the output from one group of cells to dominate the input to the following group of cells. This provides a means for monitoring the scan chain.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A circuit for control and observation of a scan chain comprising:
   a group of first scan cells connected in series, receiving a first data signal and outputting a second data signal;
   a multiplexer receiving the first and second data signals, and selectively outputting the first and second data signals in response to a selection signal; and
   a group of second scan cells connected in series, receiving the first or second data signal from the multiplexer, and outputting a third data signal.

2. The circuit as claimed, in claim 1, wherein the first and second scan cells are shift registers.

3. The circuit as claimed in claim 1 further comprising a first counter and a second counter respectively receiving the second and third data signal to count the number of 0s and 1s is carried by the second and third data signal.

4. The circuit as claimed in claim 1 further comprising a memory storing data carried by the second and third data signals.

5. The circuit as claimed in claim 1 further comprising:
   a second multiplexer receiving the second and third data signals, and selectively outputting the second and third data signals in response to a second selection signal;
   a third multiplexer receiving the second and third data signals, and selectively outputting the second and third data signals in response to a third selection signal; and
   an XOR gate receiving the second or third data signal from the second multiplexer, and the second or third data signal from the third multiplexer.

6. A circuit for control and observation of a scan chain comprising:
   a group of first scan cells connected in series, receiving a first data signal and outputting a second data signal;
   a first control gate receiving the second data signal and a first enable signal, and selectively outputting the second and a third data signals in response to the first enable signal;
   a group of second scan cells connected in series, receiving the second or third data signal from the first control gate, and outputting a fourth data signal;
   an XOR gate receiving the first and a fifth data signal, and outputting a sixth data signal; and
   a second control gate receiving a second enable signal and the sixth data signal, and outputting the first enable signal;
   wherein the first control gate outputs the second data signal in response to the first enable signal output by the second control gate when the second enable signal is at a first voltage level and data carried by the first and fifth data signals are the same, and the first control gate outputs the third data signal in response to the first enable signal output by the second control gate when the second enable signal is at the first voltage level and data carried by the first and fifth data signals are different.

7. The circuit as claimed in claim 6, wherein the first and second scan cells are shift registers.

8. The circuit as claimed in claim 6 further comprising a first counter and a second counter respectively receiving the second and fourth data signals to count the number of 0s and 1 is carried by the second and fourth data signals.

9. The circuit as claimed in claim 6 further comprising a memory storing data carried by the second and fourth data signals.

10. The circuit as claimed in claim 6, wherein the first control gate is an AND gate outputting the third data signal carrying 0s when the enable signal is at a low voltage level, and outputting the second data signal as the third data signal when the enable signal is at a high voltage level.

11. The circuit as claimed in claim 6, wherein the first control gate is an OR gate outputting the second data signal as the third data signal when the enable signal is at a low voltage level, and outputting the third data signal carrying 1s when the enable signal is at a high voltage level.

12. The circuit as claimed in claim 6, wherein the first control gate is an XOR gate outputting the second data signal as the third data signal when the enable signal is at a low voltage level, and outputting the inverted second data signal as the third data signal when the enable signal is at a high voltage level.

13. The circuit as claimed in claim 6, wherein the first control gate is a multiplexer.

14. The circuit as claimed in claim 6, wherein the first voltage level is a high voltage level, the first control gate is an OR gate and the second control gate is an AND gate.

15. The circuit as claimed in claim 6, wherein the first voltage level is a high voltage level, the first control gate is an XOR gate and the second control gate is an AND gate.

16. The circuit as claimed in claim 6, wherein the first voltage level is a high voltage level, the first control gate is an XOR gate and the second control gate is a NAND gate.

17. A circuit for control and observation of a scan chain comprising:
   a group of first scan cells connected in series, receiving a first data signal and outputting a second data signal;
   a first multiplexer receiving the second and a third data signals, and selectively outputting the second and third data signals in response to a first selection signal;
   a group of second scan cells connected in series, receiving the second or third data signal from the first multiplexer, and outputting a fourth data signal;
   a second multiplexer receiving the second and fourth data signals, and selectively outputting the second and fourth data signal signals in response to a second selection signal;
   a third multiplexer receiving the second and fourth data signals, and selectively outputting the second and fourth data signals in response to a third selection signal; and
   an XOR gate receiving the second or fourth data signal from the second multiplexer, and the second or fourth data signal from the third multiplexer.

* * * * *